US 6,590,818 B1

(12) United States Patent
Liston et al.

(10) Patent No.: US 6,590,818 B1
(45) Date of Patent: Jul. 8, 2003

(54) METHOD AND APPARATUS FOR SOFT DEFECT DETECTION IN A MEMORY

(75) Inventors: Thomas W. Liston, Austin, TX (US); Lawrence N. Herr, Coupland, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/173,229

(22) Filed: Jun. 17, 2002

(51) Int. Cl.[7] ................................. G11C 7/00
(52) U.S. Cl. ................ 365/201; 365/200; 365/202; 365/203; 365/188
(58) Field of Search ................ 365/201, 200, 365/202, 203, 188

(56) References Cited

U.S. PATENT DOCUMENTS

| | | | |
|---|---|---|---|
| 4,719,418 A | 1/1988 | Flaker et al. | |
| 5,034,923 A | 7/1991 | Kuo et al. | |
| 5,428,574 A | 6/1995 | Kuo et al. | |
| 6,163,862 A * | 12/2000 | Adams et al. | 714/718 |
| 6,182,257 B1 * | 1/2001 | Gillingham | 714/733 |
| 6,249,468 B1 | 6/2001 | Kan et al. | |
| 6,504,775 B1 * | 1/2003 | Ma et al. | 365/203 |

OTHER PUBLICATIONS

Clinton Kuo et al.; Soft–Defect Detection (SDD) Technique for a High–Reliability CMOS SRAM; IEEE Journal of Solid–State Circuits, vol. 25, No. 1, Feb. 1990; pp. 61–66.

* cited by examiner

Primary Examiner—Richard Elms
Assistant Examiner—Tuan T. Nguyen
(74) Attorney, Agent, or Firm—Joanna G. Chiu; Robert L. King

(57) ABSTRACT

A method and apparatus for soft defect detection in a memory is disclosed. Bit lines are conditioned to predetermined voltages which ensure that, upon activation of the corresponding word line, all the storage transistors within the corresponding bit cells (at the intersection of the bit lines and the word line) are electrically conductive. A change in state of the bit cell in response to activation of the corresponding word line indicates the presence of a soft defect. An evaluator coupled to the memory may be used to identify defective memories by comparing the results of the testing to determine if any bit cells changed states. In one embodiment, the conditioning of the bit lines includes charging a bit line to a first predetermined voltage and its corresponding complementary bit line to a second predetermined voltage and then connecting the bit line and complementary bit line together to equalize the voltages.

20 Claims, 5 Drawing Sheets

METHOD AND APPARATUS FOR SOFT DEFECT DETECTION IN A MEMORY

FIELD OF THE INVENTION

The present invention relates generally to memories, and more specifically, to soft defect error detection in memories.

RELATED ART

Memories require testing to ensure proper functionality prior to shipping the product. For example, memories are tested for soft-defects. Soft defects generally refer to those defects which appear under certain conditions and do not appear under other conditions. For example, a soft defect may be one that only appears at a specific voltage, temperature, and time. These soft defects are therefore difficult to detect. One known method for detecting soft defects tests SRAM (static random access memory) cells by writing predetermined data to them and reading them after a waiting period. However, the waiting period must be relatively long in order to ensure that all abnormal memory cells are failed which results in longer testing times. Therefore, any test techniques which require long waiting periods for testing incurs higher test cost. Furthermore, the above method fails to capture all soft-defects. Therefore, a need exists for an improved soft-defect detection technique which reduces testing cost and improves testing time.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" and "negate" (or "deassert") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Also, in the embodiments described herein, a signal being "high" refers to a logic level one and a signal being "low" refers to a logic level zero.

Brackets is used to indicate the conductors of a bus or the bit locations of a value. For example, "bus 60 [0–7]" or "conductors [0–7] of bus 60" indicates the eight lower order conductors of bus 60, and "address bits [0–7]" or "ADDRESS [0–7]" indicates the eight lower order bits of an address value. The symbol "$" preceding a number indicates that the number is represented in its hexadecimal or base sixteen form. The symbol "%" preceding a number indicates that the number is represented in its binary or base two form.

Figure 1:
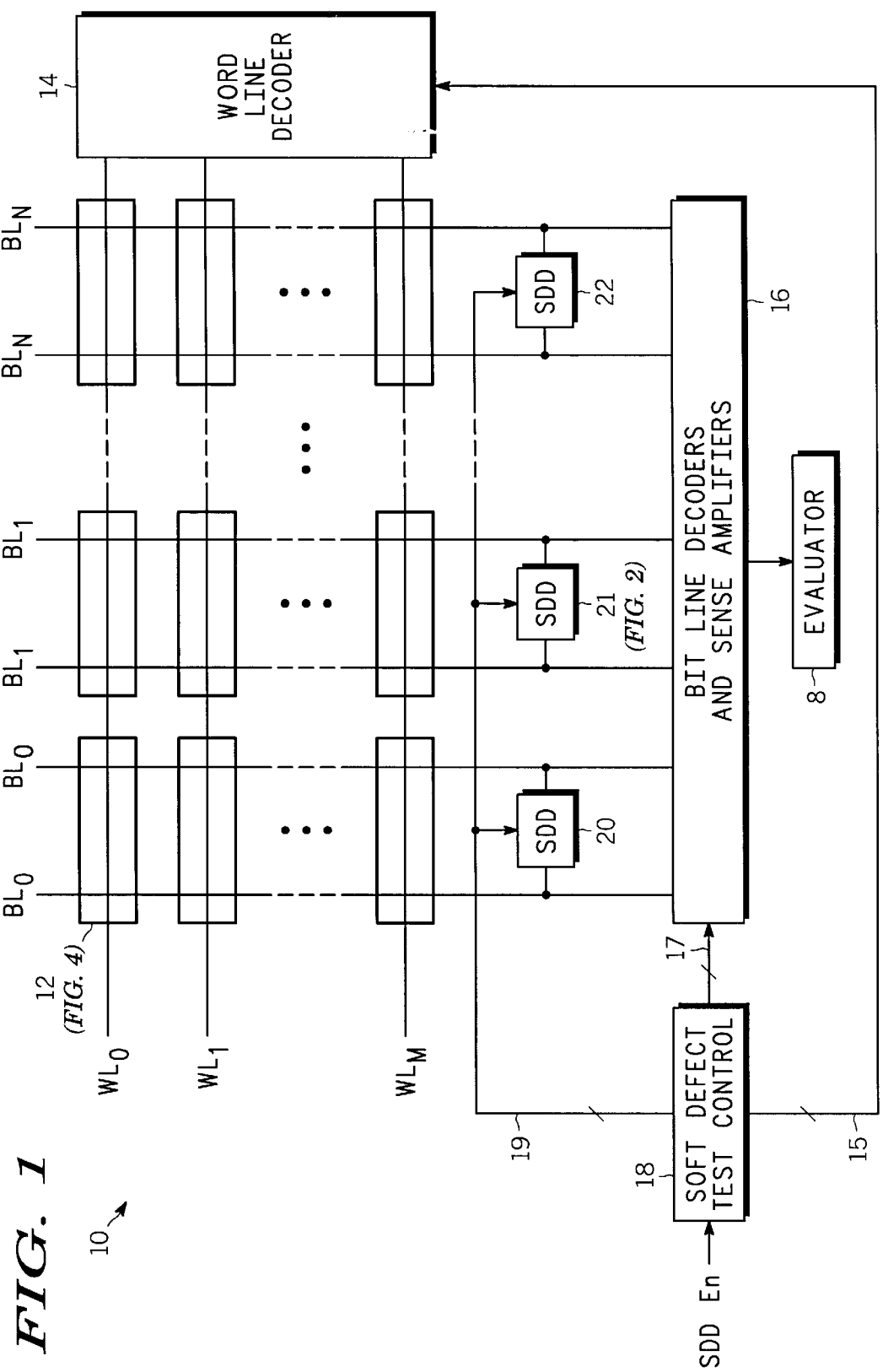
FIG. 1 illustrates, in block diagram form, a memory in accordance with one embodiment of the present invention.

FIG. 1 illustrates, in block diagram form, a memory 10 in accordance with one embodiment of the present invention. For example, in one embodiment, memory 10 (also referred to as memory array 10) is an SRAM; however, in alternate embodiments, the soft defect detection (SDD) techniques discussed herein can apply to any type of memory. Furthermore, memory 10 may refer to either an embedded memory or a stand alone memory. Memory 10 includes M+1 word lines $WL_0$–$WL_M$ and N+1 pairs of bit lines $BL_0$, $BL_0Bar$–$BL_N$, $BL_NBar$. (Note that in the drawings, the complementary bit line, $BL_xBar$, is written as $BL_x$ with a bar over it.) Therefore, memory 10 is an M+1 by N+1 memory having M+1 rows and N+1 columns. At the intersection of each bit line pair and word line is a memory cell (or bit cell) like memory cell 12. Memory 10 may therefore include any number of rows and columns.

The word lines $WL_0$–$WL_M$ are selected by word line decoder 14 coupled to each of the word lines. For example, word line decoder may receive address bits which selects one of the word lines. The bit line pairs are coupled to bit line decoders and sense amplifiers 16. Bit line decoders and sense amplifiers 16 may also include bit line precharge circuitry which may statically or dynamically precharge the bit line pairs to predetermined voltages. For example, each bit line may be precharged to Vdd and each complementary bit line (bit line bar) may also be precharged to Vdd. During a read in normal operating mode, when a word line is activated, the values stored in each of the selected bit cells are imposed on the corresponding bit line pairs. A sense amplifier, coupled to the corresponding bit line pairs, is used to sense the values within the selected bit cells. In one embodiment, a sense amplifier may be coupled to each of the bit line pairs of memory 10. However, in alternate embodiments, a group of bit line pairs may share a single sense amplifier through the use of switching circuitry, such as a multiplexer. During a write in normal operating mode, when a word line is activated, write circuitry within bit line decoders and sense amplifiers 16 causes the selected bit line and its complement to have opposite data states placed on them thus allowing the corresponding bit cell to store a value.

Memory 10 also includes circuitry for operating in an SDD mode. Memory 10 also includes SDD bit line conditioning circuits 20, 21, and 22 between each pair of bit lines. That is, SDD bit line conditioning circuit 20 is coupled between $BL_0$ and $BL_0Bar$, SDD bit line conditioning circuit 21 is coupled between $BL_1$ and $BL_1Bar$, and SDD bit line conditioning circuit 22 is coupled between $BL_N$ and $BL_N$-Bar. (Note that each bit line pair includes a bit line and a complementary bit line, where if the bit line refers to $BL_x$, the complementary bit line refers to $BL_xBar$, and if the bit line refers to $BL_xBar$, then the complementary bit line refers to $BL_x$.) Memory 10 includes soft defect test control 18 which receives an SDD enable signal, SDD En, and provides control signals to word line decoder 14 via conductors 15, to bit line decoders and sense amplifiers 16 via conductors 17, and to each SDD bit line conditioning circuit (including condition circuits 20, 21, and,22) via conductors 19. For operation in SDD mode, SDD En is asserted. During SDD mode, the bit line precharge circuits 16 are disabled. During SDD mode, the multiplexers, if any, within bit line decoders and sense amplifiers 16 may or may not be disabled. Also, during SDD mode, the functionality of word line decoder 14 is controlled by soft defect test control 18.

In one embodiment, SDD mode includes a charging phase, a shorting phase, and a word line activation phase. Note that the charging phase and shorting phase may be referred to, in combination, as a bit line conditioning phase. During the charging phase, soft defect test control 18 provides a SDD_charge signal to conditioning circuits 20, 21, and 22 (via conductors 19). In response to the SDD_charge signal, each of conditioning circuits 20, 21, and 22 couple its corresponding bit line to a first predetermined voltage and its complementary bit line to a second predetermined voltage. For example, in one embodiment (as will be discussed in more detail in reference to FIG. 2), the corresponding bit line is coupled to Vss and the complementary bit line to Vdd. Alternatively, the bit line may be coupled to Vdd and the complementary bit line to Vss. In yet other embodiments, any voltages may be used as the first and second predetermined voltages. (Note that, as used herein, Vdd is greater than Vss, where, in one embodiment, Vss refers to ground, and Vdd the power supply voltage. Therefore, Vdd and Vss may also each be referred to as power supply voltages.)

During the shorting phase, following the charging phase, each conditioning circuit 20, 21, and 22 couples its corresponding bit line to its corresponding complementary bit line in response to an SDD_short signal received from soft detect test control 18 via conductors 19 in order to average the voltage levels between the bit line and complementary bit line upon activation of the corresponding word line. In one embodiment, the resulting average voltage level on the bit line and complementary bit line is Vdd/2. The resulting average voltage level allows for each transistor within the activated bit cells to be electrically conductive when the word line is activated (i.e. addressed). If each transistor is electrically conductive, then a soft defect within any of the transistors can be detected. An example will be described in reference to an SRAM 6T cell illustrated in FIG. 4.

Figure 2:
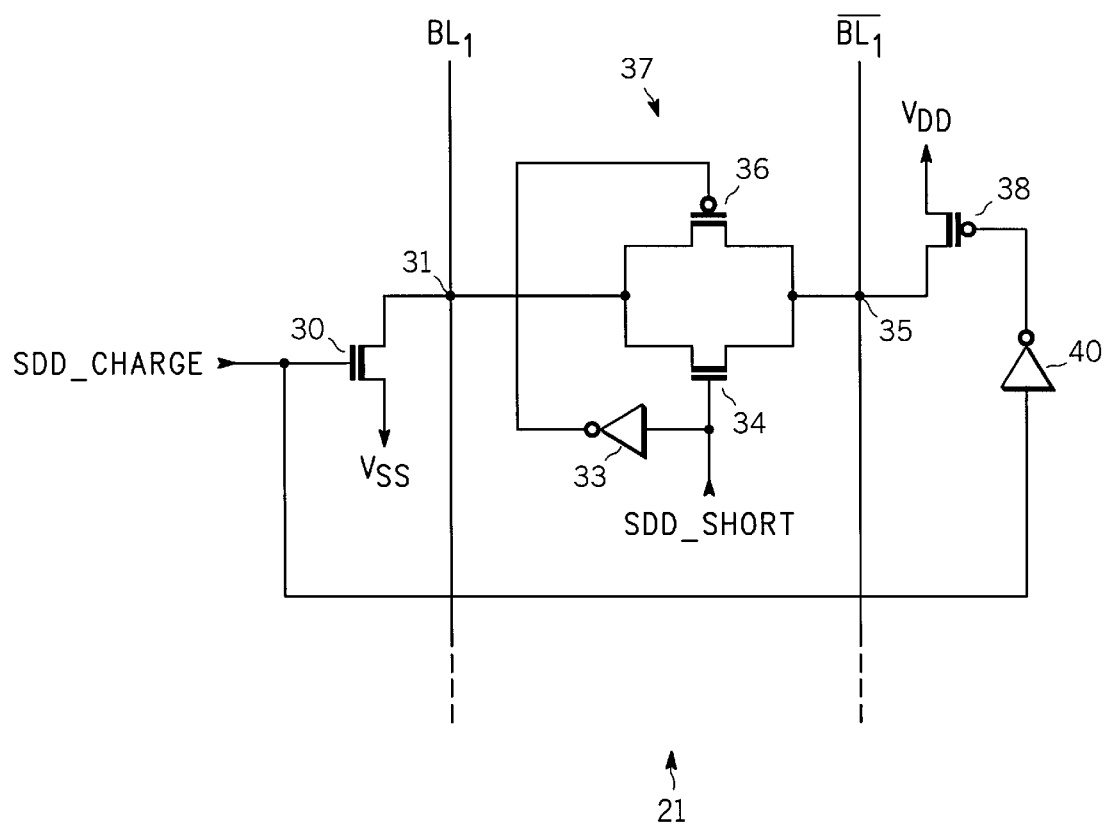
FIG. 2 illustrates, in schematic form, a shorting and charging circuit of FIG. 1 in accordance with one embodiment of the present invention.

As discussed above, the charging and shorting phases are performed by conditioning circuitry 20, 21, and 22. FIG. 2 illustrates conditioning circuit 21 in accordance with one embodiment of the present invention. (Note that the same explanations provided here with respect to conditioning circuitry 21 apply to conditioning circuitries 20 and 22.) Conditioning circuitry 21 of FIG. 2 includes a transmission gate 37 coupled between $BL_1$ and $BL_1Bar$ where the transmission gate includes a PMOS transistor 36 coupled to an NMOS transistor 34. That is, a first current electrode of transistor 36 is coupled to a first current electrode of transistor 34 and to $BL_1$ at a node 31. A second current electrode of transistor 36 is coupled to a second current electrode of transistor 34 and to $BL_1Bar$ at a node 35. A control electrode of transistor 34 is coupled to receive SDD_short from soft defect test control 18 and is also coupled to the input of an inverter 33. The output of inverter 33 is coupled to a control electrode of transistor 36. Conditioning circuit 21 also includes an NMOS transistor 30 having a first current electrode coupled to node 31, a second current electrode coupled to Vss, and a control electrode coupled to receive SDD_charge from soft defect test control 18. The control electrode of transistor 30 is also coupled to an input of inverter 40. Conditioning circuitry 21 also includes a PMOS transistor 38 having a first current electrode coupled to Vdd and a second current electrode coupled to node 35. The output of inverter 40 is coupled to a control electrode of transistor 38.

In operation, transistors 30 and 38 perform the charging phase by coupling Vss to $BL_1$ and Vdd to $BL_1Bar$ in response to SDD_charge being asserted. After SDD_charge is deasserted, SDD_short is asserted in order to equalize the charge between $BL_1$ and $BL_1Bar$ via transistors 36 and 34. After the charge is equalized, SDD_short may be deasserted. However, in alternate embodiments SDD_short may remain asserted during the word line activation phase, which will be discussed below. Note also that a variety of different circuitries may be used to accomplish the same or similar functionality as the example of FIG. 2.

During the word line activation phase, following the charging phase, a selected word line (for example, $WL_0$), is activated (i.e. addressed). That is, soft defect test control 18 provides control signals to word line decoder 14 to activate the selected word line. Upon activation of the selected word line, fully functional bit cells (i.e. those without any soft defects) do not change states. However, any defective bit cells along the activated word line which are not in their preferred state will change states. For example, if the preferred state of bit cell 12 of FIG. 1 (assuming bit cell 12 includes a soft defect) is a 1 and it is written with a 0 for testing (prior to activation of $WL_0$), activation of $WL_0$ will result in a state change (from a 0 to a 1). However, if bit cell 12 was written to a 1 for testing, activation of $WL_0$ may not result in a state change. Therefore, in some embodiments, in order to fully test bit cell 12, charging, shorting, and activation should be performed using both states 0 and 1, as will be described in more detail in reference to the flow diagram of FIG. 3. As mentioned above, during the word line activation phase, $BL_0$ and $BL_0Bar$ may or may not be still coupled together, depending on the embodiment.

After the word line activation phase, if more word lines need to be tested, the charging, shorting, and word line activation phases may be repeated, where in the word line activation phase, a new word line is selected for activation. In one embodiment, the transition among the various phases can be implemented using a state machine. Alternatively, external addresses used to cycle through the bit cells of memory 12 may be used to cycle through the various phases. For example, the two least significant bits of the external addresses may be used to cycle through the 3 phases.

As mentioned above, the charging and shorting phases may be referred to collectively as a conditioning phase. Alternate embodiments may therefore perform the conditioning phase in a variety of different ways and is not limited to the charging and shorting phases described above. For example, in an alternate embodiment, rather than performing the charging and shorting phases as described above, each bit line and complementary bit line can be coupled to a same voltage potential. That is, during a conditioning phase, prior to the word line activation phase, each bit line and complementary bit line can be coupled to a same voltage potential rather than coupling each to a different predetermined voltage and then shorting them together. Therefore, during the conditioning phase, the bit line and complementary bit line are set to voltage potentials which result in each transistor within the activated bit cells to be electrically conductive. Note, however, that each bit cell may include transistors for storing a value as well as transistors for accessing the stored value. Soft defects may be detected in any of the transistors for storing the value when all the transistors for storing the value are electrically conductive during the SDD mode.

FIG. 1 also includes an evaluator 8 coupled to receive information from bit line decoders and sense amplifiers 16 of memory 10 and analyze the results to determine if any defective bit cells exist. Evaluator 8 may be located on chip with memory 10 or may be an external analyzer or tester. For example, evaluator 8 may be a built in self tester (BIST), functional pattern, or an external programmable tester. Also, evaluator 8 may be a dedicated analyzer or a non-dedicated analyzer. In operation, evaluator 8 compares the values within the memory array 10 (after the conditioning and word line activation phases) with the values originally written to the memory array 10 (prior to the conditioning and word line activation phases) to determine the existence of defective bit cells. For example, a mismatch in the comparison indicates a defective bit cell.

Figure 3:
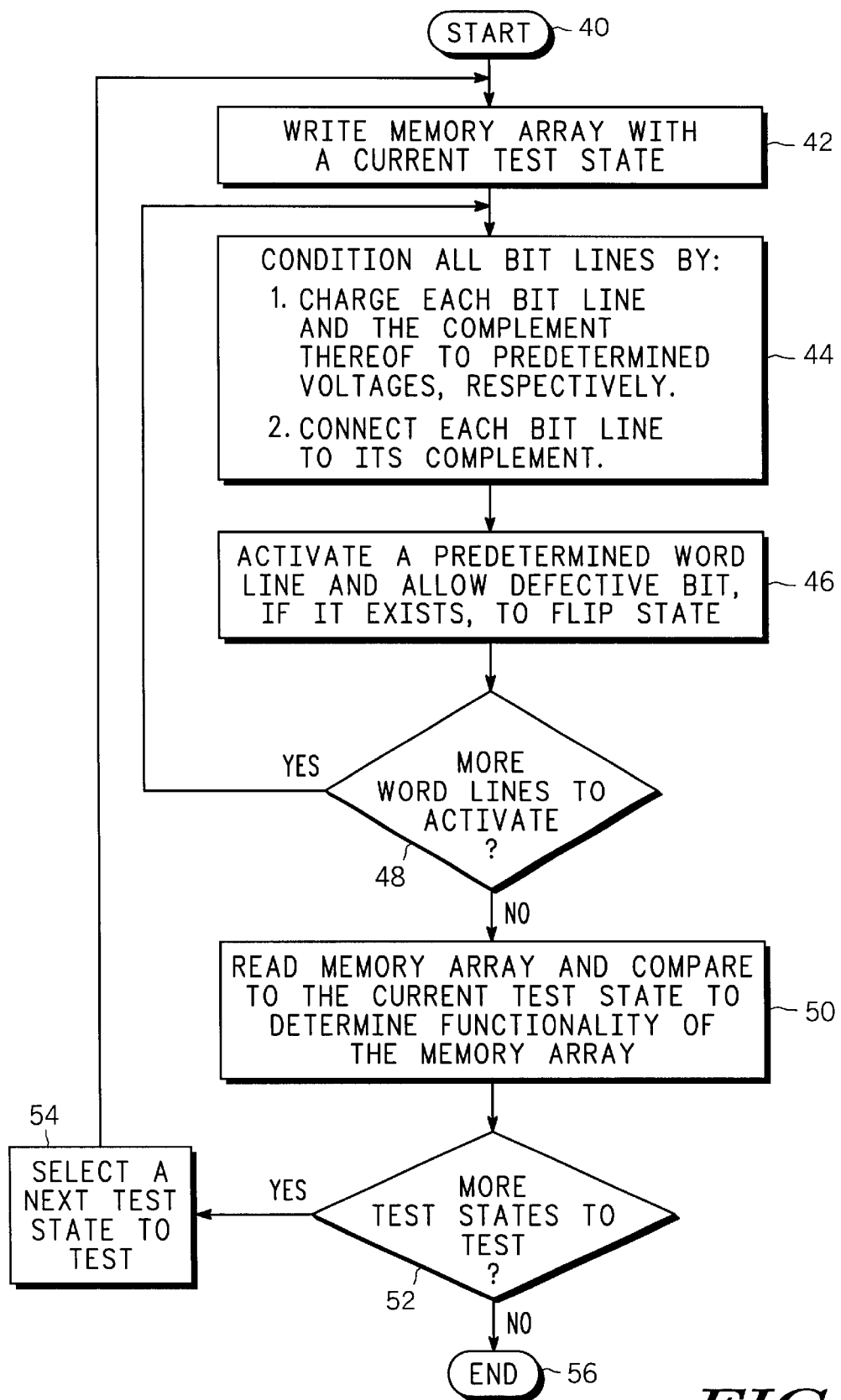
FIG. 3 illustrates, in flow diagram form, a soft defect detection method in accordance with one embodiment of the present invention.

FIG. 3 illustrates, in flow diagram form, one embodiment of an SDD method. The flow of FIG. 3 begins with start 40 and proceeds to block 42 where memory array 10 is written with a current test state. For example, memory array 10 can be written with all ones or all zeroes, or with any test pattern. Flow proceeds to block 44 where selected bit lines are conditioned (i.e. a conditioning phase). For example, as described above, in an embodiment using an SRAM cell, selected bit line pairs (each having a bit line and a complementary bit line) are conditioned in this step. In one embodiment, one bit line or bit line pair may be conditioned or a group of bit lines or bit line pairs may be conditioned (such as, for example, a group of bit line pairs along a same word line). In one embodiment, as described above, conditioning the bit lines includes charging each bit line and it's corresponding complementary bit line to a first and second predetermined voltage, respectively (i.e. a charging phase). For example, in the example given above, the bit line can be charged to Vss and the complementary bit line to Vdd. In the current embodiment, conditioning the bit lines also includes connecting each bit line to its corresponding complementary bit line (i.e. a shorting phase). This equalizes the charges between the bit line and complementary bit line. However, as mentioned above, a variety of different methods may be used to perform the conditioning phase.

Flow then proceeds to block 46 where a predetermined word line is activated (i.e. a word line activation phase) which allows a defective bit cell, if one exists, to change states. Flow then proceeds to decision diamond 48 where it is determined if more word lines to activate exists. If so, flow returns to block 44 where another bit line or group of bit lines are conditioned (such as a group of bit lines along a different word line) and in block 46, the new word line is activated. Therefore, in one embodiment, the word lines are cycled through sequentially, where each time through the loop (i.e. blocks 44 and 46), all the bit lines along the current word line are conditioned.

If, at decision diamond 48, no more words lines are left to activate, flow proceeds to block 50 where memory array 10 is read and compared to the current test state to determine functionality of memory array 10. For example, evaluator 8 may read memory array 10 to determine the new contents of memory array 10. These new contents are then compared to the current test state which was originally written to memory array 10. If there is a mismatch, a defective bit cell is indicated. Flow then proceeds to decision diamond 52 where it is determined if there are more test states to test. If so, flow proceeds to block 54 where a next test state to test is provided as the current test state and flow proceeds to block 42. For example, if the first current test state was all zeros, then the next test state may correspond to writing all ones to memory array 10 such that all bit cells are fully evaluated with both a logic one and a logic zero. Alternatively, more than two test states may be used where the flow of FIG. 3 is performed more than two times. Alternatively, only one test state may be used. Once all the test states are tested (at decision diamond 52), flow finishes with end 56.

Figure 4:
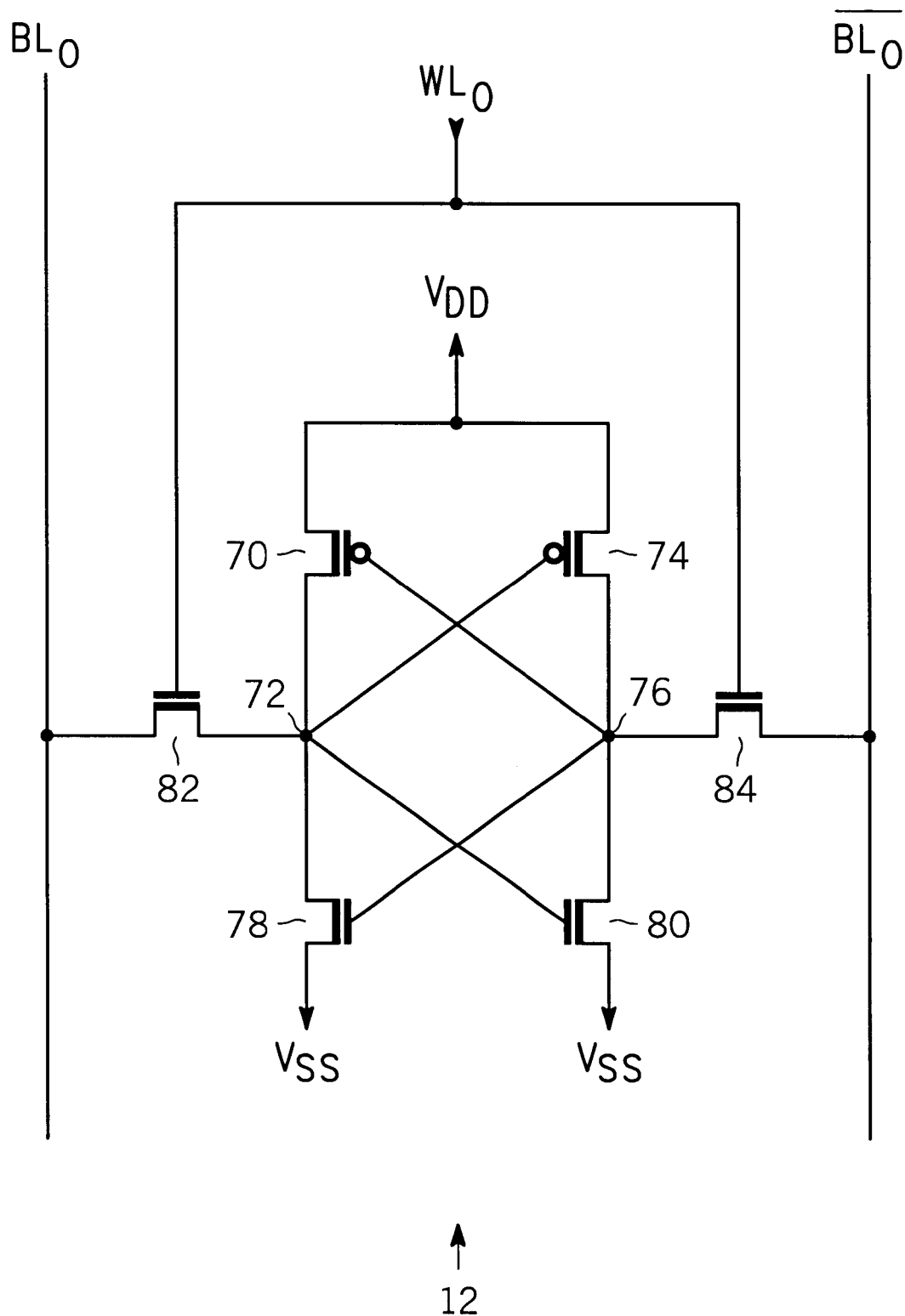
FIG. 4 illustrates, in schematic form, an SRAM cell in accordance with one embodiment of the present invention.

FIG. 4 illustrates in schematic form, one example of bit cell 12 of FIG. 1. In the example of FIG. 4, bit cell 12 is a 6T SRAM cell in accordance with one embodiment of the present invention. Bit cell 12 includes transistors 70, 74, 78, and 80, and access transistors 82 and 84. A first current electrode of access transistor 82 is coupled to $BL_0$ and a second current electrode of access transistor 82 is coupled to node 72. A control electrode of access transistor 82 is coupled to $WL_0$. A first current electrode of transistor 70 and a first current electrode of transistor 74 are coupled to Vdd, and a second current electrode of transistor 70 and a control electrode of transistor 74 are coupled to node 72. A second current electrode of transistor 74 and a control electrode of transistor 70 are coupled to a node 76. A first current electrode of transistor 78 is coupled to node 72, a second current electrode of transistor 78 is coupled to Vss, and a control electrode of transistor 78 is coupled to node 76. A first current electrode of transistor 80 is coupled to node 76, a second current electrode of transistor 80 is coupled to Vss, and a control electrode of transistor 80 is coupled to node 72. A first current electrode of access transistor 84 is coupled to node 76, a second current electrode of access transistor 84 is coupled to $BL_0Bar$, and a control electrode of access transistor 84 is coupled to $WL_0$. In one embodiment, transistors 70 and 74 are PMOS transistors and transistors 78, 80, 82, and 84 are NMOS transistors.

In operation, the 6T SRAM cell operates as known in the art. That is, nodes 72 and 76 store a value which may be accessed (read or written) via access transistors 82 and 84 which are activated via the corresponding word line for the bit cell. Therefore, transistors 70, 74, 78, and 80 operate to store a value while transistors 82 and 84 are used for accessing the stored value. However, note that when access transistors 82 and 84 are active, they may also operate to help store the stored value. Furthermore, when access transistors 82 and 84 are active, transistors 70 and 74 may not be needed.

As described above, during the conditioning phase of in the SDD mode, the charges on $BL_0$ and $BL_0Bar$ are equalized (via charging and shorting phases) or set to a same voltage in order to ensure that transistors 70, 74, 78, and 80 are electrically conductive upon activation of $WL_0$. For example, in one embodiment which equalizes the charges on the bit line and complementary bit line, the average voltage level is Vdd/2 which makes all transistors 70, 74, 78, and 80 electrically conductive. Therefore, upon activation of $WL_0$, the series-connected transistors 70 and 78 and series-connected transistors 74 and 80 are conductive (where, in the illustrated example, transistors 70 and 78, as well as transistors 74 and 80, are of opposite conductivity types).

Figure 6:
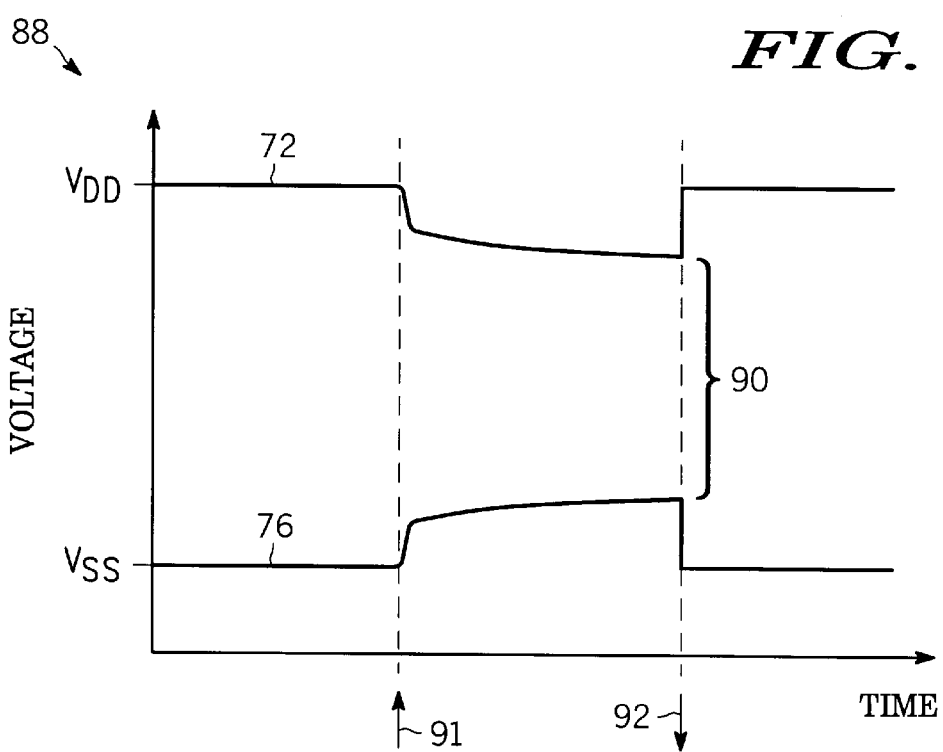

If there are no defects in bit cell 12, conditioning the bit lines and activation of the corresponding word line does not result in a state change of the stored value. For example, FIG. 6 illustrates waveforms corresponding to the voltage at node 72 and the voltage at node 76. If the voltage at node 72 is originally high (corresponding to Vdd) and the voltage at node 76 is originally low (corresponding to Vss), then bit cell 12 stores a logic level one. Upon activation of $WL_0$, indicated by arrow 91 in FIG. 6, access transistors 82 and 84 are activated and the voltage at node 76 rises because as current is conducted via transistors 84 and 80, the voltage of transistor 80 increases. The voltage at node 72 drops because when $BL_0$ is at Vdd/2, current is pulled from Vdd via transistors 70 and 82. The voltages at nodes 72 and 76 eventually reach a steady state value. When the corresponding word line is deactivated (as indicated in FIG. 6 by arrow 92), the voltages at nodes 72 and 76 simply return to the original values which correspond to the same state as was stored prior to activating the word line. That is, a state change in bit cell 12 does not occur. Note also that the difference in voltage 90 in FIG. 6 should remain large enough to ensure robust operation. That is, if the different 90 becomes too small, then bit cell 12 may become too sensitive to process variations.

Figure 5:
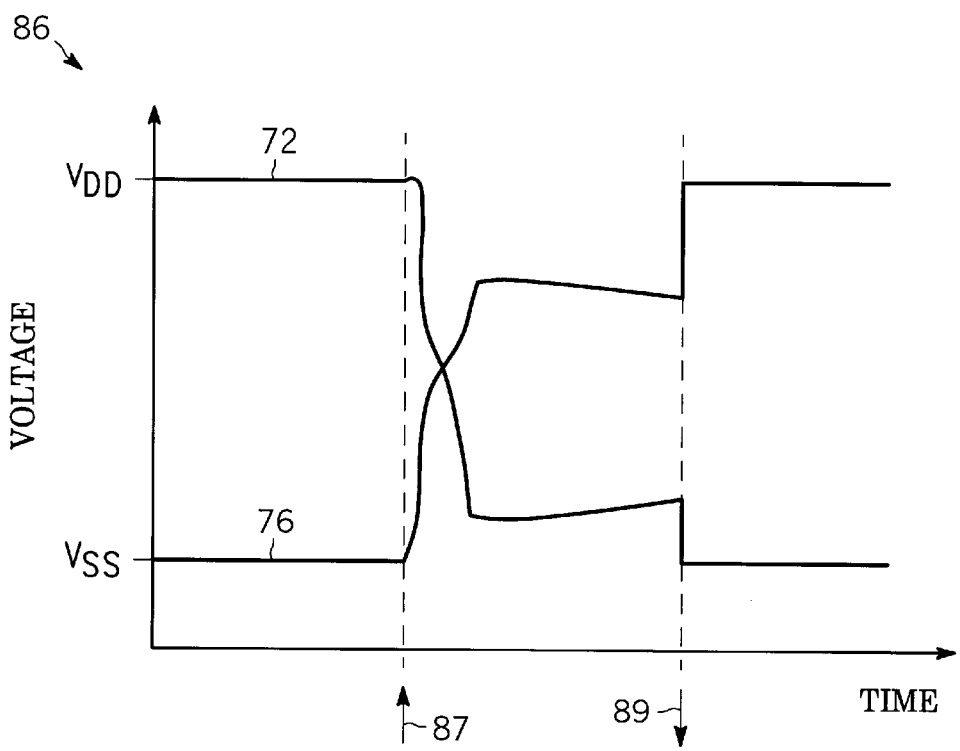
FIGS. 5–6 illustrate, in graph form, voltage waveforms corresponding to the SRAM cell of FIG. 4, in accordance with various embodiments of the present invention.

However, if any of transistors 70, 74, 78, and 80 includes a defect, conditioning of the bit lines and subsequent activation of the corresponding word line results in a state change, thus indicating the existence of a defect, as will be described in reference to FIG. 5. FIG. 5 illustrates waveforms corresponding to the voltage at node 72 and the voltage at node 76, assuming bit cell 12 is defective (in the current example, transistor 70 is assumed to be defective). As in FIG. 6, if the voltage at node 72 is originally high (corresponding to Vdd) and the voltage at node 76 is originally low (corresponding to Vss), then bit cell 12 stores a logic level one. Upon activation of $WL_0$, indicated by arrow 87 in FIG. 5, access transistors 82 and 84 are activated. Since transistor 70 is considered to be defective (resistive or open) in the current example, the voltage at node 72 drops by a sufficiently large amount to cause bit cell 12 to become unstable and thereby change states. For example, when the voltage of node 72 drops too much, transistor 80 begins to conduct less current and transistor 74 conducts more current. This can cause transistor 78 to conduct more current which eventually destroys the stored value in bit cell 12. Also, the voltage at node 76 rises because, as stated previously, transistor 74 conducts more. As seen in FIG. 5, the defective transistor 70 results in a state change. Therefore, upon deactivation of the corresponding word line (illustrated by arrow 89 in FIG. 5), bit cell 12 stores a different state (e.g. a logic level 0).

Note that any defect in any one or more of transistors 70, 74, 78, and 80 results in a state change of bit cell 12 due to instability within the bit cell caused by the defective transistor or transistors. Note also that this state change occurs upon activation of the corresponding word line, which allows for at speed testing for soft defects. (At speed testing refers to testing at a speed that is substantially similar to the normal operating speed of memory 10.) That is, a long waiting time after activation of the word line is not required since the state change (assuming a defect exists) occurs immediately in response to the word line activation. Note also that the waveforms of FIGS. 5 and 6 may be reversed such that prior to activation arrows 87 and 91, the voltage at node 72 is low and the voltage at node 76 is high such that the waveforms correspond to initially storing a logic level 0 rather than a logic level 1. In this case, in FIG. 6, assuming a non defective bit cell, the waveforms after deactivation arrow 92 still corresponding to a logic level 0 and in FIG. 5, assuming a defective bit cell, the waveforms after deactivation arrow 89 corresponds to a changed state, i.e. logic level 1.

Note that the SDD methods described herein may be used on multiple bit cells in parallel. For example, all bit cells along a selected word line may be conditioned in parallel for subsequent word line activation. In this manner, activation of a single word line affects multiple bit cells which further reduces testing time. For some embodiments, the peak (or dynamic) currents can be controlled such that the conditioning phase does not draw anymore current than is drawn during normal operation of the memory.

Although the invention has been described with respect to specific conductivity types or polarity of potentials, skilled artisans appreciated that conductivity types and polarities of potentials may be reversed. Furthermore, different circuit elements may be used than those illustrated. Also, different transistor types may be used for the various circuits. The methods described herein may be performed in hardware or software or in a combination of hardware and software. Portions of the methods described above may also be implemented in firmware. The methods described herein may also be performed within a single integrated circuit or with a combination of integrated circuits. For example, the memory array can be located in an integrated circuit and evaluator 8 can be located within the same integrated circuit, or within a different integrated circuit. Also, the blocks within the flow diagram of FIG. 3 can be performed in a different order or may include more or less steps than those illustrated.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for testing a memory array comprising:
   implementing the memory array with a plurality of memory cells, each of the memory cells comprising a plurality of transistors;
   writing the memory array;
   conditioning a plurality of bit lines and complementary bit lines in the memory array by charging each of the plurality of bit lines and complementary bit lines respectively to a predetermined first voltage and to a predetermined second voltage, the predetermined first voltage and the predetermined second voltage having values that do not change bit states of fully functional bits of the memory array when the fully functional bits are addressed;

activating a predetermined word line, the predetermined word line selecting a row of memory cells and making all of the plurality of transistors of each memory cell in the row of memory cells to electrically conduct;

reading the predetermined word line;

comparing results from the reading of the predetermined word line with bit values that were written to the predetermined word line to determine if any memory cell bit states in the predetermined word line were modified; and identifying modified memory cells as failing the testing.

2. The method of claim 1 further comprising:

using a same voltage potential for the first predetermined voltage and the second predetermined voltage.

3. The method of claim 1 further comprising:

electrically directly connecting each of the plurality of bit lines with its respective complementary bit line prior to activating the predetermined word line, the electrically directly connecting adjusting the predetermined first voltage and the predetermined second voltage to be substantially equal.

4. The method of claim 3 further comprising:

continuing to electrically directly connect each of the plurality of bit lines with its respective complementary bit line during the activating of the predetermined word line.

5. The method of claim 3 further comprising:

disconnecting each of the plurality of bit lines with its respective complementary bit line during the activating of the predetermined word line.

6. The method of claim 1 further comprising:

implementing the memory array so that the plurality of transistors in each of the memory cells is six comprising two transistors of a first conductivity type and four transistors of a second conductivity type.

7. The method of claim 1 further comprising:

sequentially activating a plurality of predetermined word lines in the memory array to sequentially test each of the plurality of memory cells.

8. The method of claim 7 further comprising:

conditioning the plurality of bit lines and complementary bit lines by simultaneously applying the predetermined first voltage and predetermined second voltage to all of the plurality of bit lines and complementary bit lines along a predetermined word line at a same time; and sequentially activating the plurality of predetermined word lines at a speed that is substantially equal to a normal operating speed of the memory when the memory is not being tested.

9. The method of claim 1 further comprising:

writing the memory array with one or more additional test states after identifying any memory cells as failing the testing, the one or more additional test states being followed by the conditioning, the activating, the reading, the comparing and the identifying for purposes of identifying any further memory cells as being faulty.

10. A memory array having bit functionality test circuitry, comprising:

a plurality of memory cells, each of the memory cells comprising a plurality of transistors;

circuitry coupled to the plurality of memory cells for writing the memory array;

test circuitry for conditioning a plurality of bit lines and complementary bit lines in the memory array by charging each of the plurality of bit lines and complementary bit lines respectively to a predetermined first voltage and to a predetermined second voltage, the predetermined first voltage and the predetermined second voltage having values that do not change bit states of fully functional bits of the memory array when the fully functional bits are addressed, the test circuitry also activating a predetermined word line, the predetermined word line selecting a row of memory cells and making all of the plurality of transistors of each memory cell in the row of memory cells to electrically conduct, any faulty memory cells changing bit state in response to the activating; and means for outputting bit states of the memory cells coupled to the plurality of memory cells.

11. The memory of claim 10 further comprising:

compare means coupled to the means for outputting, the compare means reading the predetermined word line that was written to and determining if any memory cell bit states in the predetermined word line were modified.

12. The memory of claim 10 wherein the memory array is implemented on an integrated circuit and the compare means is external to the integrated circuit.

13. The memory of claim 10 further comprising:

means for identifying modified memory cells as failing the testing.

14. The memory of claim 13 wherein the memory array is implemented on an integrated circuit and the means for identifying modified memory cells is a programmable tester that is external to the integrated circuit.

15. The memory of claim 13 wherein the memory array is implemented on an integrated circuit and the means for identifying modified memory cells is a built-in self test (BIST) circuit implemented on the integrated circuit.

16. The memory of claim 10 wherein the test circuitry that charges each of the plurality of bit lines and complementary bit lines respectively to a predetermined first voltage and to a predetermined second voltage comprises for each bit line and complementary bit line:

a first transistor of a first conductivity type having a first current electrode coupled to a first bit line, a control electrode for receiving a first control signal, and a second current electrode coupled to a first reference voltage terminal;

a second transistor of a second conductivity type having a first current electrode coupled to a second reference voltage terminal, a control electrode for receiving a complement of the first control signal, and a second current coupled to a complement of the first bit line; and switching means coupled between the first bit line and the complement of the first bit line for selectively electrically connecting the first bit line and the complement of the first bit line in response to a second control signal.

17. A method of detecting defects in a memory array comprising:

writing the memory array with a current test state, the memory array having rows and columns of memory cells;

conditioning a portion of bit lines of the memory array and a corresponding complement bit line thereof for each of the portion of bit lines by charging each of the portion of bit lines to predetermined voltages, respectively;

connecting each bit line of the portion of bit lines to its corresponding complement bit line, wherein a resultant voltage on each bit line of the portion of bit lines and its corresponding complement bit line does not modify any memory states of non-defective memory cells of the memory array;

activating a predetermined word line in the memory, the activating making all of a plurality of transistors of each memory cell in a predetermined row of memory cells to electrically conduct; and allowing any bits contained within the predetermined word line to change its memory state, such bits being defective as a result of a change in memory state.

18. The method of claim 17 further comprising:

electrically directly connecting each of the portion of bit lines with its respective complementary bit line prior to activating the predetermined word line, the electrically directly connecting adjusting the predetermined voltages to be substantially equal.

19. The method of claim 17 further comprising:

sequentially activating a plurality of predetermined word lines in the memory array to sequentially test each of the plurality of memory cells; and conditioning the portion of bit lines and corresponding complement bit lines by simultaneously applying the predetermined voltages to all of the portion of bit lines and corresponding complement bit lines along a predetermined word line at a same time;

wherein the sequentially activating of the plurality of predetermined word lines is at a speed that is substantially equal to a normal operating speed of the memory when the memory is not being tested.

20. The method of claim 17 further comprising:

implementing the memory array so that each of the memory cells comprises a plurality of transistors wherein a first pair of series-connected transistors of opposite conductivity are both conductive during the activating and a second pair of series-connected transistors of opposite conductivity are both conductive during the activating.

* * * * *